United States Patent
Weaver et al.

(10) Patent No.: US 7,781,843 B1
(45) Date of Patent: Aug. 24, 2010

(54) INTEGRATING HIGH-VOLTAGE CMOS DEVICES WITH LOW-VOLTAGE CMOS

(75) Inventors: James Weaver, Corvallis, OR (US); S. Jonathan Wang, Albany, OR (US); John Chen, Corvallis, OR (US); Sadiq Bengali, Corvallis, OR (US); Edward Enciso, Houston, TX (US); Tom Cooney, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 293 days.

(21) Appl. No.: 11/652,182

(22) Filed: Jan. 11, 2007

(51) Int. Cl.
*H01L 21/335* (2006.01)

(52) U.S. Cl. .............. 257/369; 257/E21.632; 438/142

(58) Field of Classification Search ........... 438/142; 257/369, E21.632
See application file for complete search history.

(56) References Cited

U.S. PATENT DOCUMENTS

| | | | |
|---|---|---|---|
| 4,325,180 A | 4/1982 | Curran | |
| 4,628,341 A | 12/1986 | Thomas | |
| 5,041,895 A | 8/1991 | Contiero et al. | |
| 5,047,358 A | 9/1991 | Kosiak et al. | |
| 5,254,487 A | 10/1993 | Tamagawa | |
| 5,340,756 A | 8/1994 | Nagayasu | |
| 5,366,916 A | 11/1994 | Summe et al. | |
| 5,498,554 A | 3/1996 | Mei | |
| 5,504,451 A * | 4/1996 | Smayling et al. | 327/438 |
| 5,527,722 A | 6/1996 | Hutter et al. | |
| 5,545,577 A | 8/1996 | Tada | |
| 5,585,294 A | 12/1996 | Smayling et al. | |
| 5,747,850 A | 5/1998 | Mei | |
| 5,811,850 A | 9/1998 | Smayling et al. | |
| 5,847,432 A | 12/1998 | Nozaki | |
| 5,852,314 A | 12/1998 | Depetro et al. | |
| 5,880,502 A | 3/1999 | Lee et al. | |
| 6,017,797 A | 1/2000 | Furukawa | |
| 6,033,958 A | 3/2000 | Chou et al. | |
| 6,071,775 A | 6/2000 | Choi et al. | |
| 6,087,232 A | 7/2000 | Kim et al. | |
| 6,127,213 A | 10/2000 | Tung | |
| 6,133,077 A | 10/2000 | Randazzo | |
| 6,144,069 A | 11/2000 | Tung | |
| 6,267,479 B1 | 7/2001 | Yamada et al. | |
| RE37,424 E | 10/2001 | Contiero et al. | |
| 6,348,382 B1 | 2/2002 | Su et al. | |
| 6,576,512 B2 | 6/2003 | Taniguchi et al. | |
| 6,686,233 B2 * | 2/2004 | Soderbarg et al. | 438/217 |

(Continued)

OTHER PUBLICATIONS

H. Ballan et al. "High Voltage Devices and Circuits in Standard CMOS Technologies" (Ch. 3) Dordrecht, NL (1999) pp. 51-76.

(Continued)

*Primary Examiner*—Thao X Le
*Assistant Examiner*—Matthew Gordon

(57) ABSTRACT

High-voltage CMOS devices and low-voltage CMOS devices are integrated on a common substrate by forming a sacrificial film over at least active device areas, lithographically defining device active regions of the high-voltage CMOS devices, implanting dopants selectively through the sacrificial film into the lithographically defined device active regions of the high-voltage CMOS devices, diffusing the implanted dopants, removing the sacrificial film, and subsequently forming low-voltage CMOS devices.

15 Claims, 6 Drawing Sheets

U.S. PATENT DOCUMENTS

| | | |
|---|---|---|
| 6,818,494 B1 | 11/2004 | Chen et al. |
| 6,902,258 B2 | 6/2005 | Chen et al. |
| 6,939,757 B2 | 9/2005 | Kim |
| 2004/0092133 A1* | 5/2004 | Hyun et al. ............. 438/787 |
| 2005/0258496 A1 | 11/2005 | Tsuchiko |
| 2006/0017114 A1* | 1/2006 | Chen et al. ............. 257/371 |
| 2006/0030107 A1 | 2/2006 | Huang et al. |
| 2006/0211190 A1 | 9/2006 | Chen et al. |
| 2006/0270162 A1 | 11/2006 | Lin et al. |

OTHER PUBLICATIONS

S. Thompson et al. "MOS Scaling: Transistor Challenges for the 21st Century" Intel Technology Journal, Q3'98 (1998), pp. 1-19.

E. Morifuji et al. "Supply and Threshold-Voltage Trends for Scaled Logic and SRAM MOSFETs," IEEE Trans. Electron Dev. V. 53, No. 6, Jun. 2006, pp. 1427-1432.

H-S. Kim et al. "Breakdown Voltage Enhancement of the p-n Junction by Self-Aligned . . . " IEEE Electron Dev. Letters V. 16/9 (Sep. 1995) pp. 405-407.

* cited by examiner

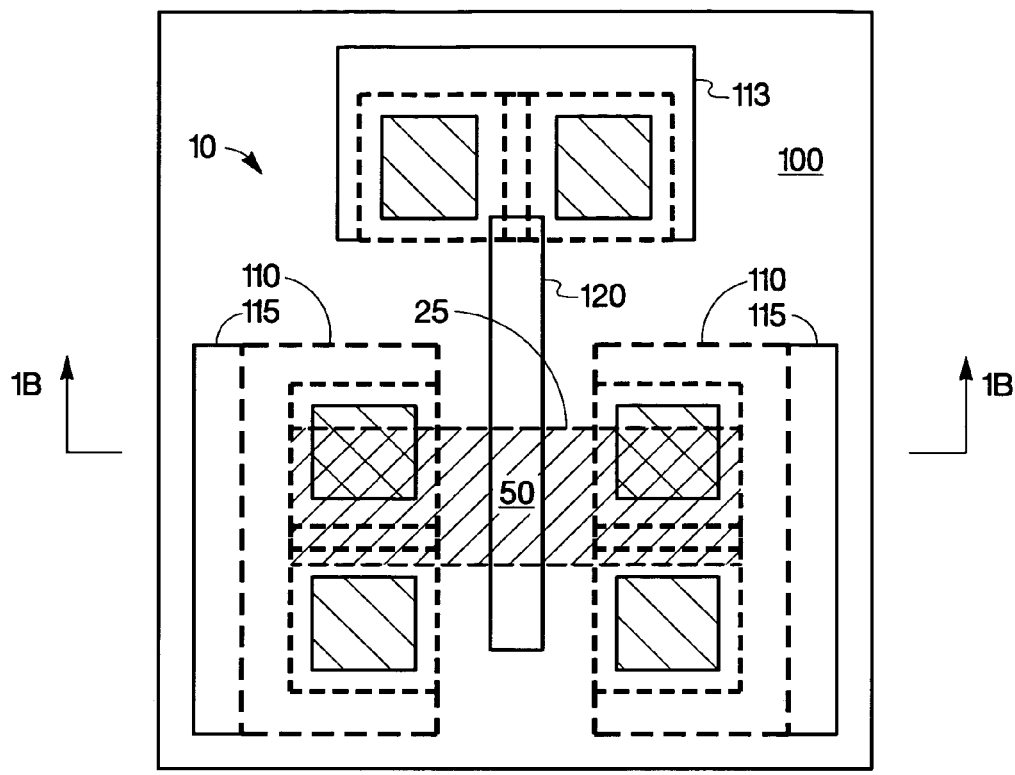
Fig. 1A
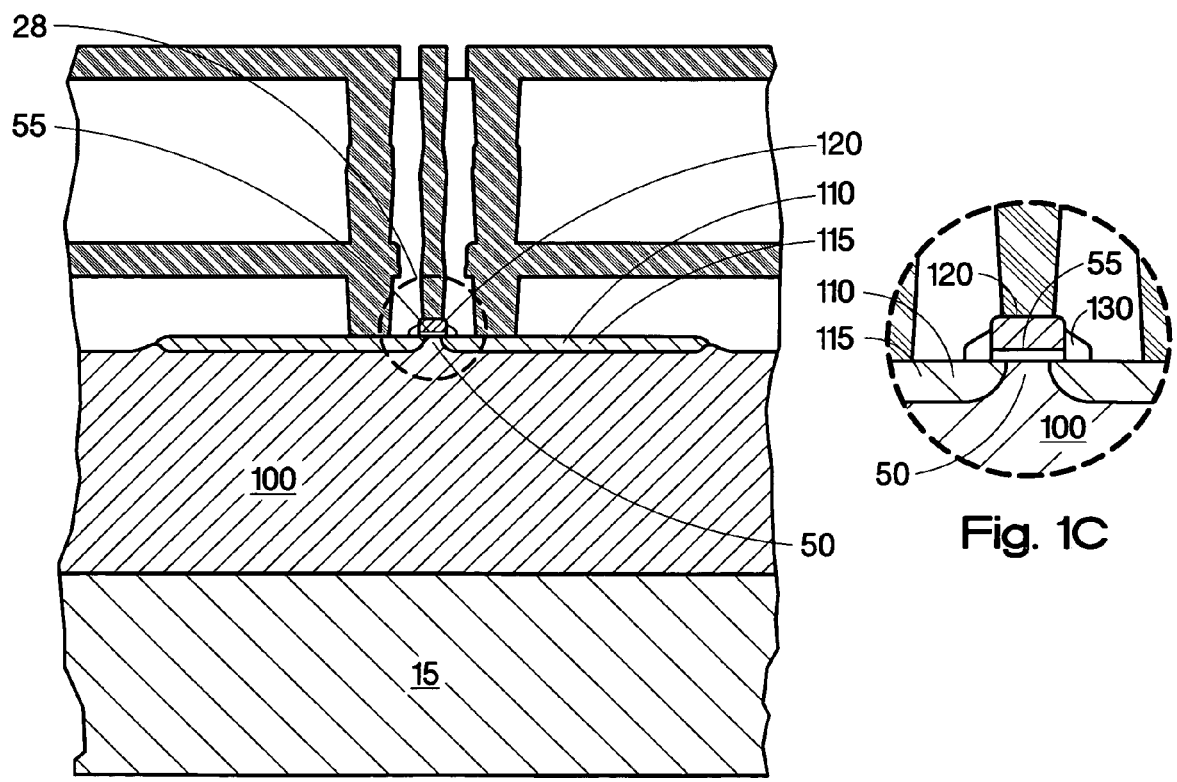
Fig. 1B
Fig. 1C

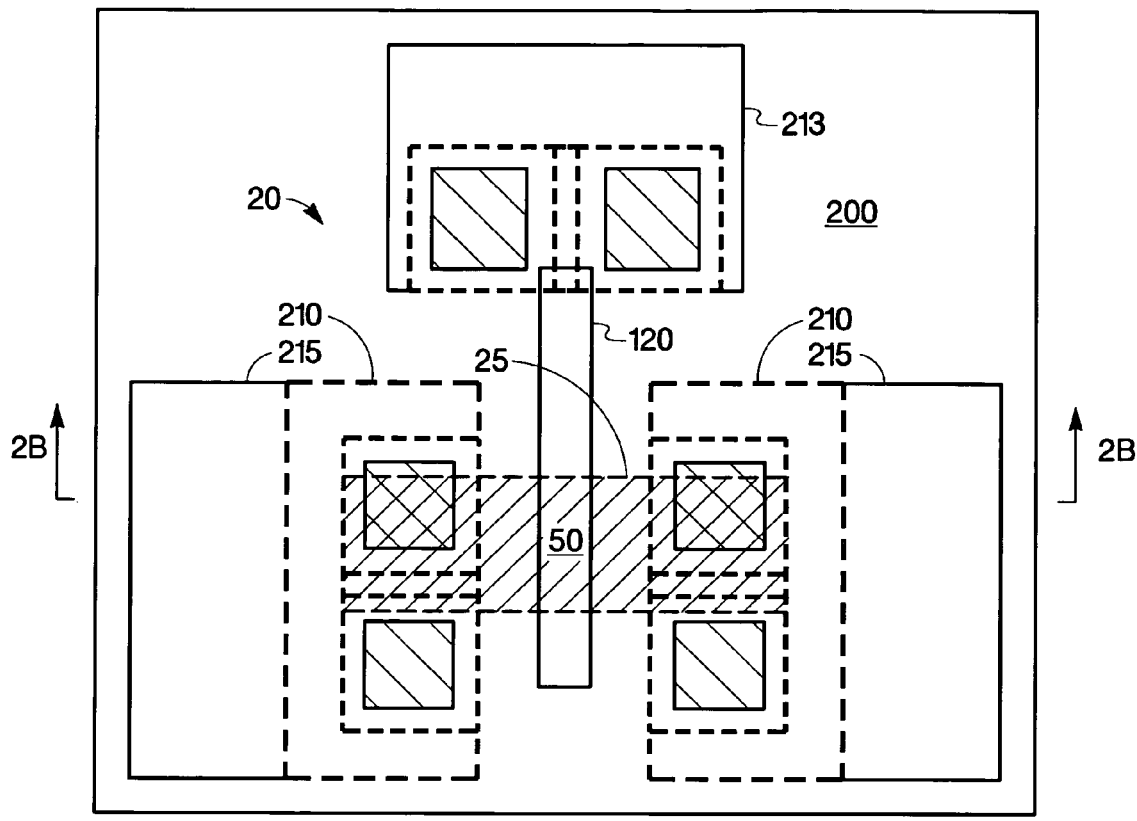
Fig. 2A
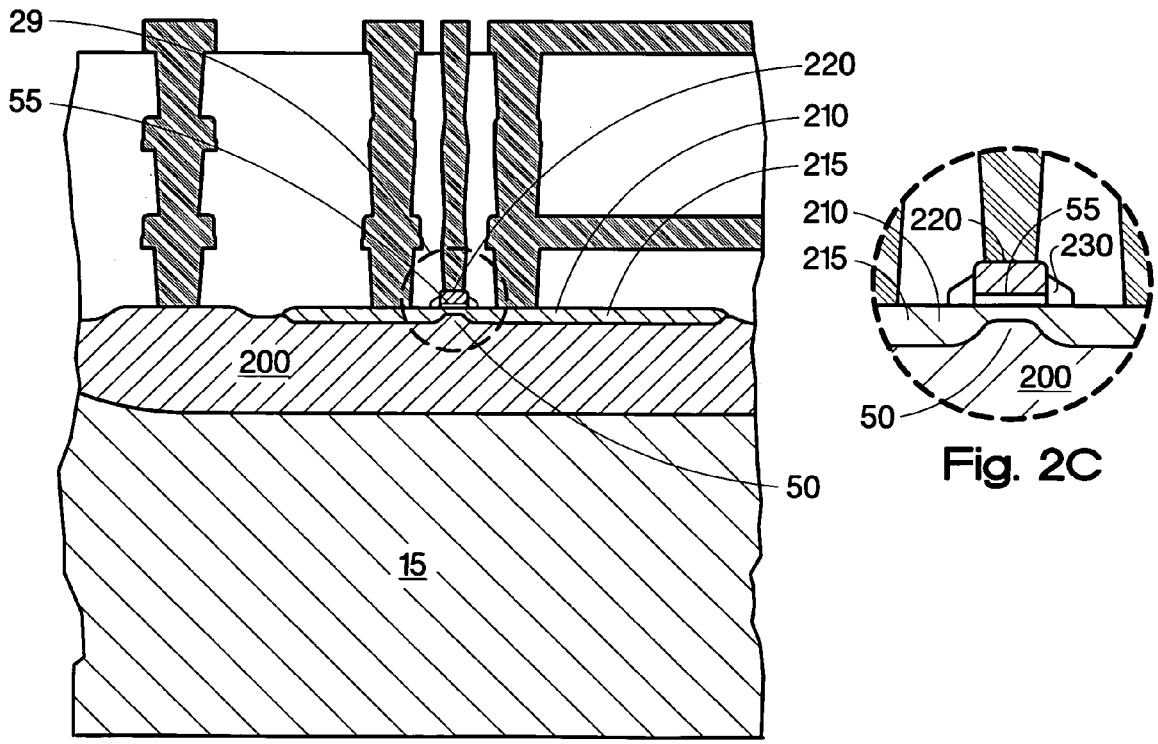
Fig. 2B
Fig. 2C

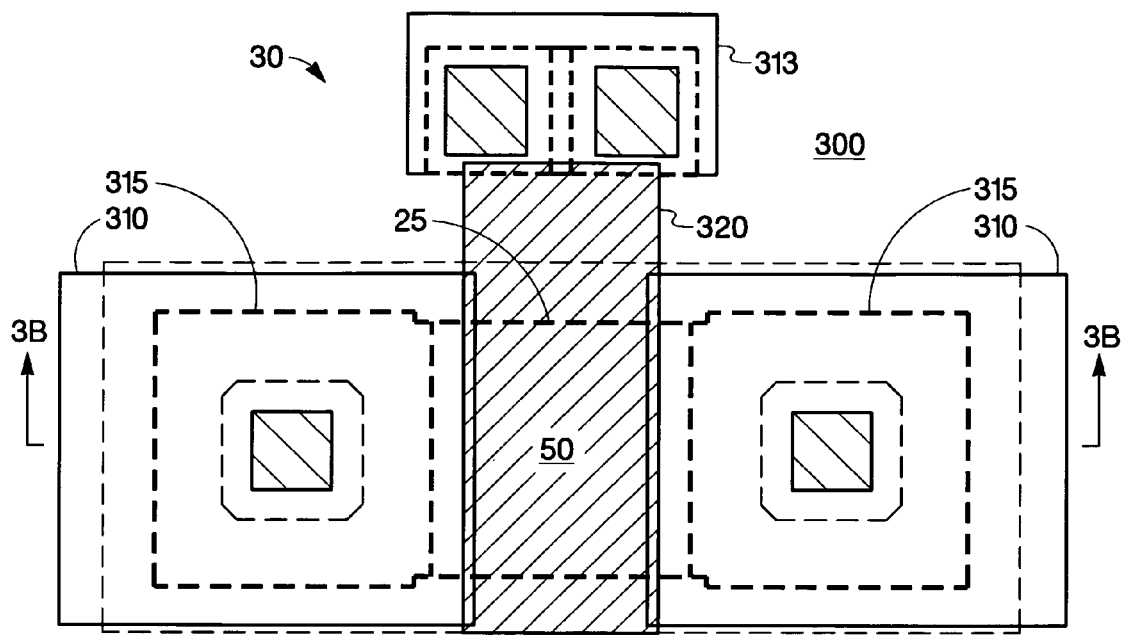
Fig. 3A
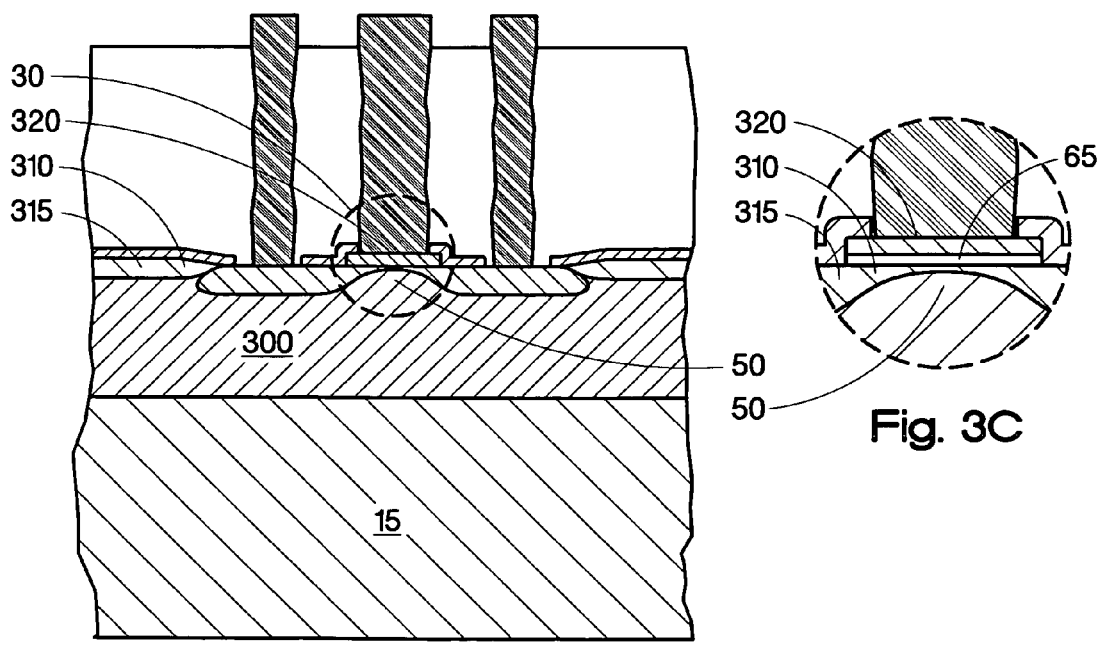
Fig. 3B
Fig. 3C

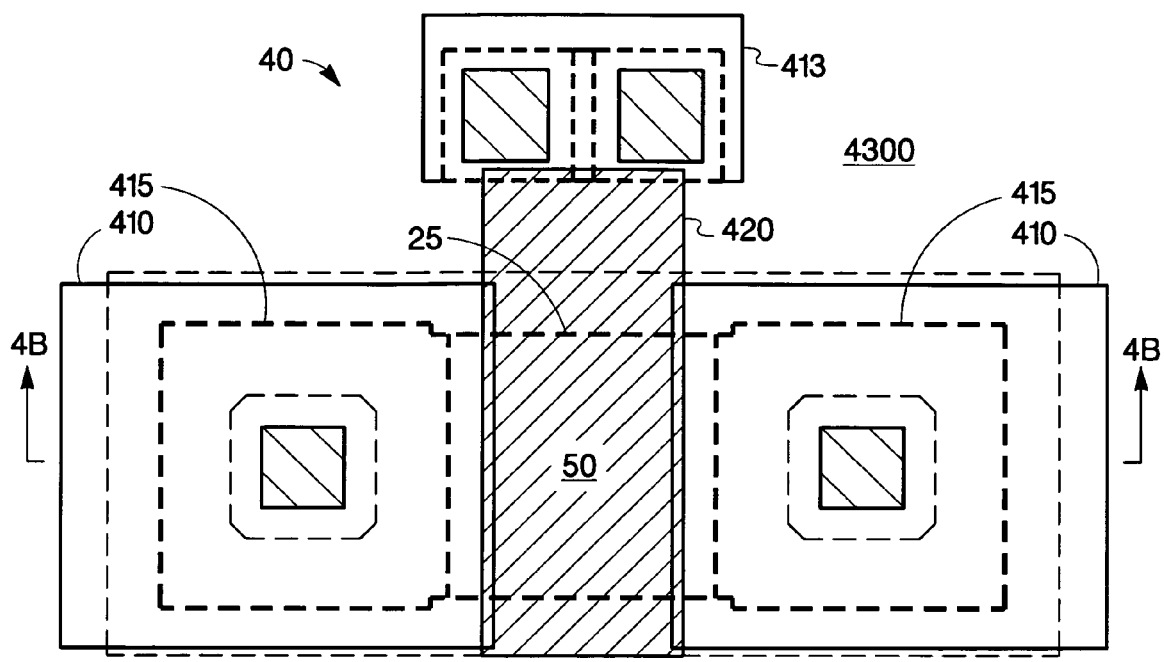
Fig. 4A
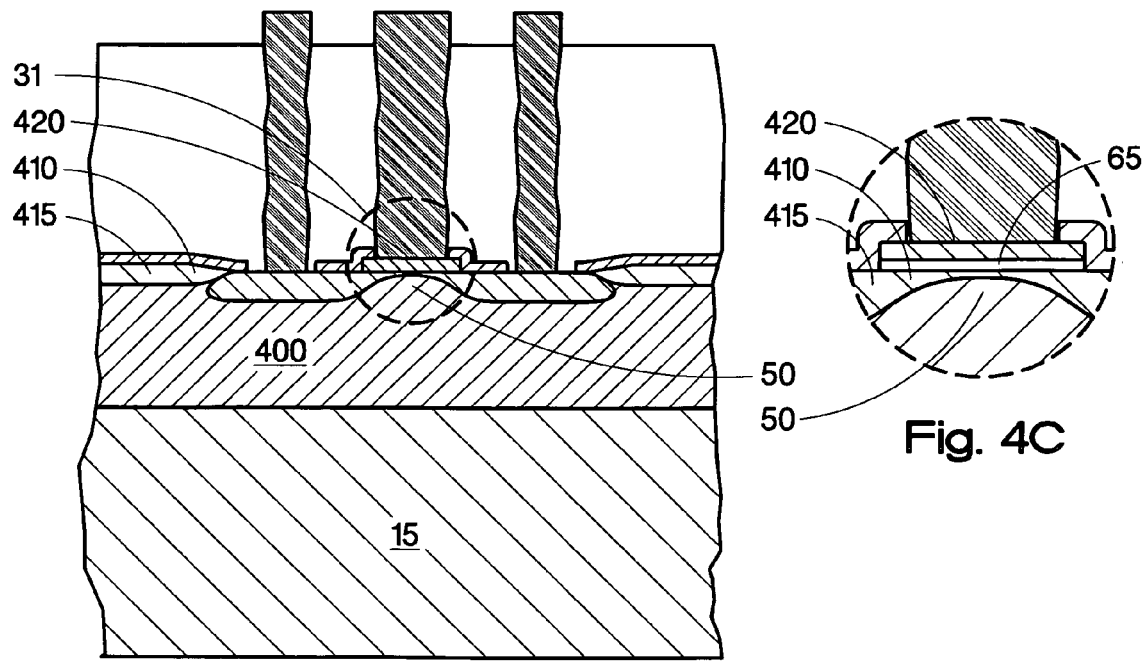
Fig. 4B
Fig. 4C

INTEGRATING HIGH-VOLTAGE CMOS DEVICES WITH LOW-VOLTAGE CMOS

CROSS-REFERENCE TO RELATED APPLICATION

This application is related to co-pending and commonly assigned application Ser. No. 11/176,033, filed Jul. 6, 2005, the entire disclosure of which is incorporated herein by reference.

TECHNICAL FIELD

This invention relates to integrating high-voltage CMOS devices with low-voltage CMOS circuits.

BACKGROUND

MOSFET (Metal Oxide Silicon Field Effect Transistor) devices may fall within one or more classes of devices, such as high-voltage and low-voltage devices. Low voltage MOSFETs may be configured to operate at a voltage generally less than 5 volts, such as by operating at equal to or less than approximately 3-4 volts, and high voltage MOSFETs may be configured to operate at less than generally 40 volts. Devices such as these may have varying structural differences, such as differing channel regions with differing dopant concentrations, to provide particular capabilities for operating at particular voltages, and may additionally have varying formation processes. The semiconductor industry uses a variety of methods for creating high-voltage devices (i.e., JFETS, DMOS, BiCMOS, and others).

Products such as displays, ink jet printers, sensors, and others often require the incorporation of high-voltage controls in the circuit designs that support the product. A capability to integrate high-voltage devices and low-voltage devices into the same circuit design can reduce the cost of the product and can result in a higher performance product.

For example, it may be desirable to perform a process for making a CMOS (complementary metal oxide semiconductor) integrated circuit formed on a substrate to allow having one or more MOSFETs that may be capable of operating at high voltages and one or more MOSFETs that may be capable of operating at low voltages. However, the formation of active devices such as these may involve modifying a low voltage formation process with additional masking, implanting, and thermal cycle processes. These additional process steps may disrupt the conventional process flow and may involve the expenditure of additional time or expense. It is desirable to enable integration of high-voltage CMOS capability with low-voltage CMOS circuitry without extensively modifying the low voltage performance.

BRIEF DESCRIPTION OF THE DRAWINGS

The features and advantages of the disclosure will readily be appreciated by persons skilled in the art from the following detailed description when read in conjunction with the drawings, wherein:

FIG. 1A is a top plan view of an embodiment of a low-voltage NMOS (LVNMOS) device.

FIG. 1B is a side elevation cross-sectional view of an embodiment of a low-voltage NMOS (LVNMOS) device.

FIG. 1C is a partial view showing enlarged details of FIG. 1B.

FIG. 2A is a top plan view of an embodiment of a low-voltage PMOS (LVPMOS) device.

FIG. 2B is a side elevation cross-sectional view of an embodiment of a low-voltage PMOS (LVPMOS) device.

FIG. 2C is a partial view showing enlarged details of FIG. 2B.

FIG. 3A is a top plan view of an embodiment of a high-voltage NMOS (HVNMOS) device.

FIG. 3B is a side elevation cross-sectional view of an embodiment of a high-voltage NMOS (HVNMOS) device.

FIG. 3C is a partial view showing enlarged details of FIG. 3B.

FIG. 4A is a top plan view of an embodiment of a high-voltage PMOS (HVPMOS) device.

FIG. 4B is a side elevation cross-sectional view of an embodiment of a high-voltage PMOS (HVPMOS) device.

FIG. 4C is a partial view showing enlarged details of FIG. 4B.

FIG. 1C is a magnified view of detail 28 of FIG. 1B. FIG. 2C is a magnified view of detail 29 of FIG. 2B. FIG. 3C is a magnified view of detail 30 of FIG. 3B. FIG. 4C is a magnified view of detail 31 of FIG. 4B.

DETAILED DESCRIPTION OF EMBODIMENTS

Figure 5A:
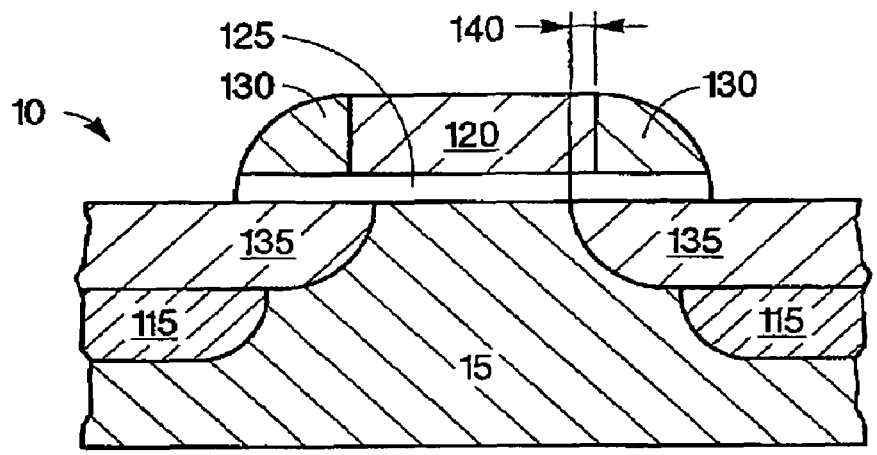
FIG. 5A is a simplified side elevation cross-sectional view of an embodiment of a low-voltage CMOS (LVCMOS) device.

For clarity of the description, the drawings are not drawn to a uniform scale. In particular, vertical and horizontal scales may differ from each other and may vary from one drawing to another. In this regard, directional terminology, such as "top," "bottom," "front," "back," "leading," "trailing," etc., is used with reference to the orientation of the drawing figure(s) being described. Because components of the invention can be positioned in a number of different orientations, the directional terminology is used for purposes of illustration and is in no way limiting.

Although, for clarity and simplicity of the description, the drawings generally show symmetric embodiments, the embodiments are not limited to symmetric designs. Those skilled in the art will recognize that asymmetric device embodiments may also be made having performance advantages similar to those of the symmetric embodiments shown and described, and being made by essentially the same processes, as described in detail below.

Throughout this specification and the appended claims, the terms "low-voltage CMOS" (LVCMOS), "low-voltage NMOS," "low-voltage PMOS," etc. refer to various kinds of CMOS devices operable with voltages below about eight volts and the terms "high-voltage CMOS" (HVCMOS), "high-voltage NMOS," "high-voltage PMOS," etc. refer to various kinds of CMOS devices operable with voltages above about eight volts, i.e., the supply voltage ($V_{dd}$) exceeds about eight volts. There is nothing especially critical about the value of eight volts; it is a convenient approximate voltage that may be used to distinguish between high- and low-voltage devices. Those skilled in the art will recognize that the threshold voltages of HVCMOS devices are also generally correspondingly higher than the threshold voltages of LVCMOS devices. The term "overlap" denotes the lateral distance that a source/drain extension (SDE) extends on each side under the gate electrode of a CMOS device. The terms "gate oxide" and "gate dielectric" are conveniently used interchangeably herein; those skilled in the art will recognize that gate dielectrics may include materials other than oxides.

One aspect of the invention provides embodiments of an integrated circuit device, including a substrate, a number of low-voltage CMOS devices formed in the substrate, the low-voltage CMOS devices being salicided devices operable with $V_{dd}$ of less than about eight volts, and a number of high-voltage CMOS devices formed in the substrate, the high-voltage CMOS devices having non-self-aligned gates and the high-voltage CMOS devices being operable with $V_{dd}$ of greater than about eight volts.

FIGS. 1A-4A illustrate top plan views of various embodiments of CMOS devices and FIGS. 1B-4B illustrate corresponding side elevation cross-sectional views of those embodiments. FIGS. 1C, 2C, 3C, and 4C are partial views showing enlarged details of FIGS. 1B, 2B, 3B, and 4B respectively.

For example, FIG. 1A is a top plan view of an embodiment of a low-voltage NMOS (LVNMOS) device 10, and FIGS. 1B and 1C are side elevation cross-sectional views of that embodiment, the three figures together showing substrate 15, laterally diffused drain 25, low-voltage gate dielectric 55, P-well 100, active area 110, gate contact 113, source and drain 115, channel 50, gate electrode 120, and oxide sidewall spacers 130.

FIG. 2A is a top plan view of an embodiment of a low-voltage PMOS (LVPMOS) device 20, and FIGS. 2B and 2C are side elevation cross-sectional views of that embodiment, the three figures together showing substrate 15, laterally diffused drain 25, low-voltage gate dielectric 55, N-well 200, active area 210, gate contact 213, source and drain 215, channel 50, gate electrode 220, and oxide sidewall spacers 230.

FIG. 3A is a top plan view of an embodiment of a high-voltage NMOS (HVNMOS) device 30, and FIGS. 3B and 3C are side elevation cross-sectional views of that embodiment, the three figures together showing substrate 15, channel 50, high-voltage gate dielectric 65, P-well 300, active area 310, gate contact 313, source and drain 315, and gate electrode 320. Although the drawings are not drawn to scale, those skilled in the art will recognize that the high-voltage gate dielectric 65 is thicker than low-voltage gate dielectric 55.

FIG. 4A is a top plan view of an embodiment of a high-voltage PMOS (HVPMOS) device 40, and FIGS. 4B and 4C are side elevation cross-sectional views of that embodiment, the three figures together showing substrate 15, channel 50, high-voltage gate dielectric 65, N-well 400, active area 410, gate contact 413, source and drain 415, and gate electrode 420. Again, although the drawings are not drawn to scale, those skilled in the art will recognize that the high-voltage gate dielectric 65 is thicker than low-voltage gate dielectric 55.

Figure 5B:
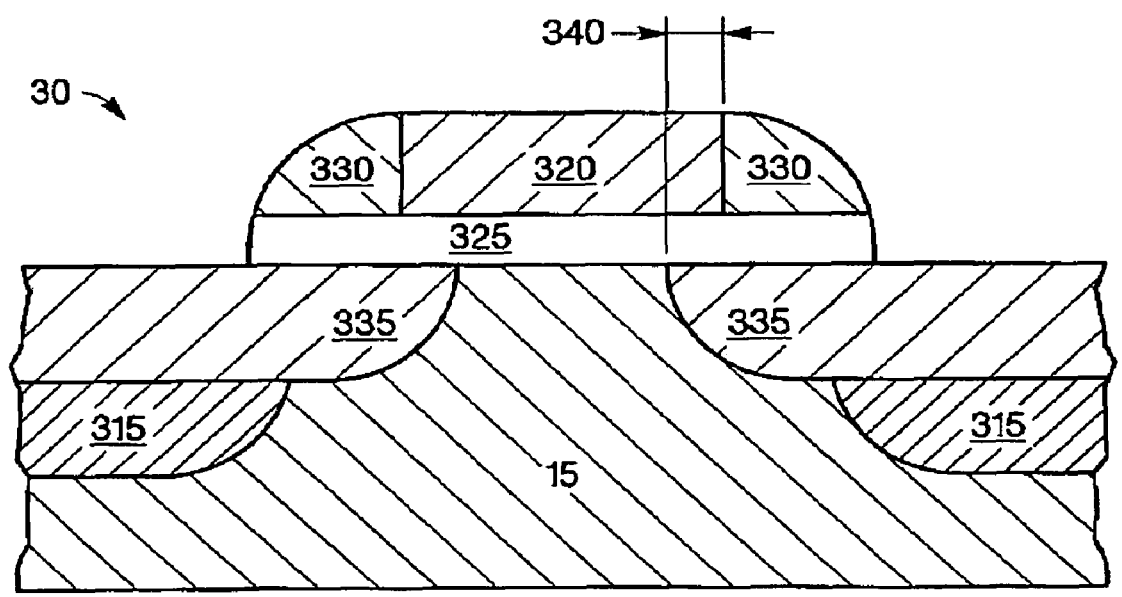
FIG. 5B is a simplified side elevation cross-sectional view of an embodiment of a high-voltage CMOS (HVCMOS) device.

FIGS. 5A and 5B show simplified side elevation cross-sectional views of embodiments of low-voltage CMOS (LVCMOS) and high-voltage CMOS (HVCMOS) devices. These drawings, which are not drawn to any uniform scale, omit any distinction between PMOS and NMOS devices, which are shown in more detail in FIGS. 1A-4C.

FIG. 5A is a simplified side elevation cross-sectional view of an embodiment of a symmetric low-voltage CMOS (LVCMOS) device 10, showing the substrate 15, source and drain 115, the low-voltage gate dielectric 125, the self-aligned gate electrode 120 formed in a salicide process, and dielectric sidewall spacers 130. The low-voltage gate dielectric 125 of FIG. 5A is equivalent to the low-voltage gate dielectric 55 of FIGS. 1C and 2C. As shown in FIG. 5A, the source/drain extensions (SDE's) 135 of LVCMOS device 10 may have a relatively narrow overlap 140, e.g., about 180 nanometers.

FIG. 5B is a simplified side elevation cross-sectional view of an embodiment of a high-voltage CMOS (HVCMOS) device 30, showing the source and drain 315, the high-voltage gate dielectric 325, the non-self-aligned gate electrode 320 defined lithographically, and dielectric sidewall spacers 330. The high-voltage gate dielectric 325 of FIG. 5B is equivalent to the high-voltage gate dielectric 65 of FIGS. 3C and 4C. Those skilled in the art will recognize that the high-voltage gate dielectric 325 is thicker than low-voltage gate dielectric 125 of FIG. 5A.

As shown in FIG. 5B, the source/drain extensions (SDE's) 335 of HVCMOS device 30 have a relatively wide overlap 340, e.g., about 1200 nanometers.

Figure 6:
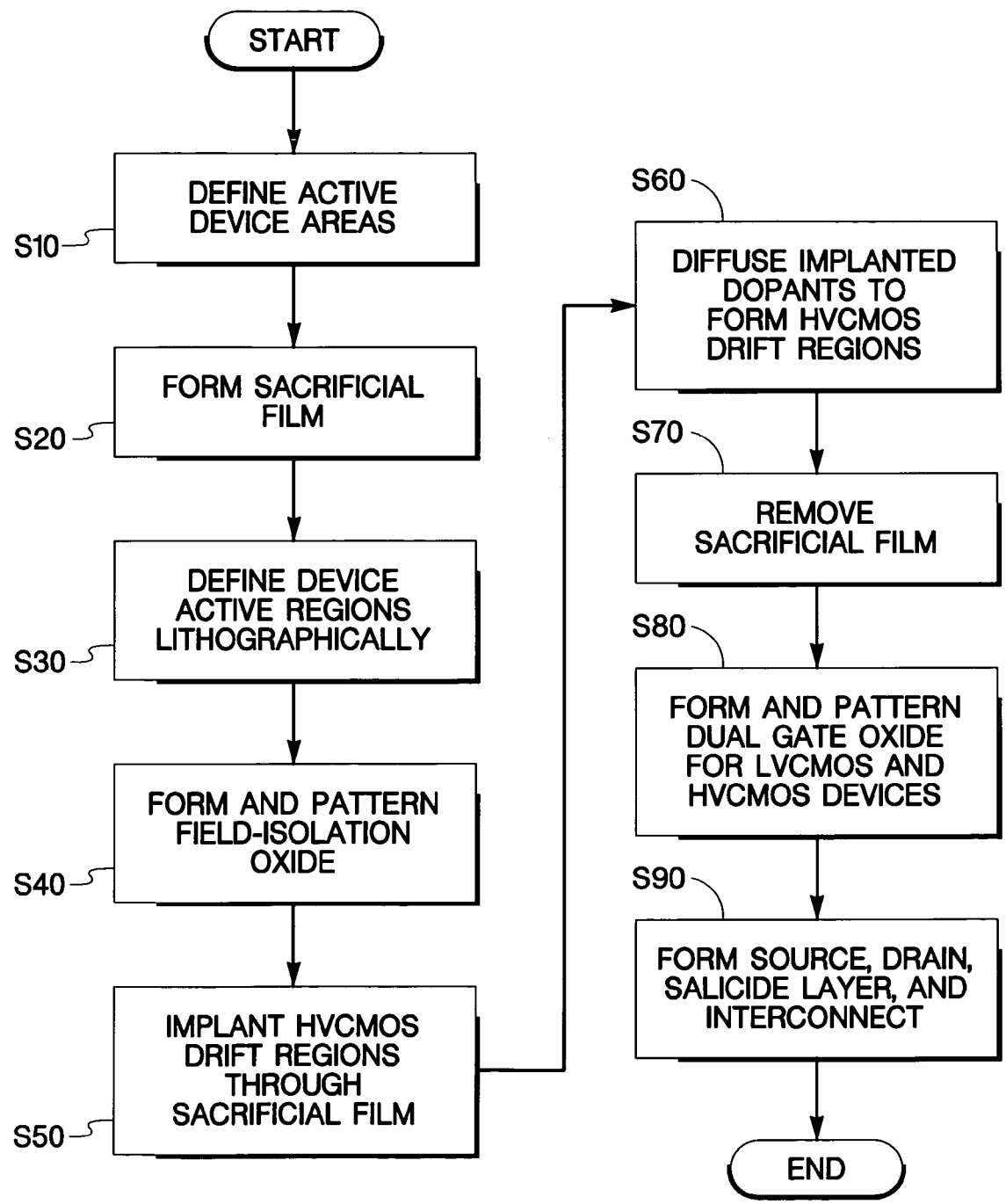
FIG. 6 is a simplified flow chart illustrating an embodiment of a method for fabricating embodiments of low-voltage CMOS (LVCMOS) devices and high-voltage CMOS (HVCMOS) devices in a common substrate.

FIG. 6 is a simplified flow chart illustrating an embodiment of a method for fabricating embodiments of low-voltage CMOS (LVCMOS) devices and high-voltage CMOS (HVCMOS) devices in a common substrate. Steps of the process are denoted by reference numerals S10, S20, . . . , S90. Arrows show a nominal order of the steps. Not all steps shown are required for every device embodiment. Those skilled in the art will recognize that some steps may be performed in a different order. Thus, the arrows and the sequence of reference numerals S10, S20, . . . , S90 are not intended to limit the order of steps to the order in which steps are shown and described.

As shown in FIG. 6, active device areas are defined (step S10) and a sacrificial film is formed (step S20) over at least the active device areas. The sacrificial film formed over at least the active device areas may be a silicon nitride film. A lithographic process is used in step S30 to pattern device active regions of at least the high-voltage CMOS devices. The lithographic process includes depositing and patterning a photoresist. In this method embodiment, gates of the high-voltage CMOS devices are not self-aligned.

A field-isolation oxide may be formed and patterned (step S40) for both the high-voltage and low-voltage CMOS devices.

In step S50, dopants are implanted through the sacrificial film selectively into the drift regions of the high-voltage CMOS devices. Implanting step S50 may be performed after forming the field-isolation oxide in step S40. The implant energy may be controlled to be high enough to penetrate the sacrificial film but not high enough to penetrate through the field-isolation oxide. The implanted dopants for the drift regions of the high-voltage CMOS devices are diffused (step S60). The sacrificial film is removed (step S70).

After step S70 of removing the sacrificial film, a step S80 is performed, forming and patterning dual gate oxide for the LVCMOS and HVCMOS devices. A base oxide is formed and patterned. The base oxide is selectively removed at least from areas of low-voltage gate oxide 55 of the low-voltage CMOS devices while leaving the base oxide at least in areas of high-voltage gate oxide 65 of the high-voltage CMOS devices. Thus, the HVCMOS source and drain are formed before any channel tuning is performed for the low-voltage CMOS devices as described below.

Subsequently, low-voltage CMOS devices are formed in step S90. Step S90 may include a salicide process whereby gates of the low-voltage CMOS devices are self-aligned. Step S90 forms the source, drain, salicide layer, and interconnects of the low-voltage CMOS devices. The low-voltage CMOS devices include a low-voltage gate oxide 55 and a low-voltage-device channel.

Tuning of the LVCMOS devices is accomplished by setting the channel dopant, gate oxide thickness, and gate length (device effective channel length). This tuning includes control of lithography, oxide growth, and implants, which would otherwise be sensitive to the impact of the thermal budget of the HV device source/drain diffusion and gate oxide formations. As described above, the HV device source/drain operations have been performed before setting the LVCMOS gate oxide, performing the LV channel implants, and controlling the LVCMOS gate CD. HV channel implant for the HVPMOS and the native threshold voltage $V_t$ of the HVNMOS devices have been set previously, before step S90. Such a sequence effectively enables substantially independent tuning of HV and LV devices.

When the steps are performed in the sequence shown in FIG. 6, implanting step S50 and diffusing step S60 are performed before forming the low-voltage gate oxide 55 and before any doping of the low-voltage-device channel for the low-voltage CMOS devices.

The diffusing step S60 may also be performed after forming and patterning the field-isolation oxide in step S40. Dopant loss and dopant segregation are eliminated by implanting the high voltage source and drain regions through the sacrificial layer after formation of the field-isolation oxide. Diffusing the high-voltage drift regions with the sacrificial layer still in place also ensures lack of outgassing and a more uniformly graded junction.

The high-voltage CMOS devices have channel length dimensions and source/drain extension dimensions that are defined by step S30 of lithographically defining source and drain regions of high-voltage CMOS devices, and the source/drain extension dimensions including overlap 340 are further defined by dielectric spacers as illustrated in FIG. 5B. Those skilled in the art will recognize that dielectric spacers are not normally defined lithographically, but are effectively self-aligned in conventional practice, not requiring a mask. In step S30, the lithography exploits the dielectric film as a "hard mask" to define a space where the highly doped source/drain implants and salicide are prevented from negating the benefit of the more lightly doped drift implants.

Thus, another aspect of the invention provides embodiments of a method for making device embodiments that include combinations of high-voltage CMOS devices and low-voltage CMOS devices, integrated on a common substrate.

In embodiments of this method, a sacrificial film is formed over at least active device areas, source and drain regions of the high-voltage CMOS devices are lithographically defined, dopants are implanted selectively through the sacrificial film into the lithographically defined source and drain regions of the high-voltage CMOS devices, the implanted dopants are diffused, the sacrificial film is removed, and low-voltage CMOS devices are subsequently formed. Integrated circuit embodiments made by such methods are described and illustrated hereinabove.

Another aspect of the present invention provides embodiments of a method of using high-voltage CMOS devices and low-voltage CMOS devices on a common substrate, including forming on the common substrate high-voltage CMOS devices having lithographically defined non-self-aligned gates by implanting high-voltage-device-junction dopants through a sacrificial film and diffusing the high-voltage-device-junction dopants before any low-voltage gate oxide 55 is formed and before any low-voltage-device channel-doping, and then subsequently removing the sacrificial film and forming, on the same common substrate, low-voltage CMOS devices having self-aligned gates.

Thus, such method embodiments may include forming a base oxide after removing the sacrificial film, the base oxide being selectively removed at least from areas of low-voltage gate oxide 55 of the low-voltage CMOS devices while leaving the base oxide at least in areas of high-voltage gate oxide 65 of the high-voltage CMOS devices. Thus, the high-voltage gate oxides 65 are made thicker than low-voltage gate oxides 55.

In practical use, such methods may also include providing $V_{dd}$ voltages less than about eight volts for operation of the low-voltage CMOS devices, and providing $V_{dd}$ voltages greater than about eight volts for operation of the high-voltage CMOS devices.

All of the CMOS FET devices shown in FIGS. 1A-5B may be integrated on a single integrated circuit (IC) chip, and may be formed in combination with other circuitry (such as MEMS devices) so as to form a functional system (such as a computer subsystem), although in alternative embodiments they may be formed on physically separate IC devices.

INDUSTRIAL APPLICABILITY

Devices made in accordance with the invention are useful in integrated circuits used in electronic products. The embodiments disclosed use a relatively low cost approach, providing scalable high-voltage CMOS devices and allowing for more compact design rules, resulting in relatively high packing density.

The methods described result in a high-voltage design that is efficient with respect to area- or pattern-density and that has the potential of being tuned for minor variations in the high-voltage specifications. The methods described allow for a high-voltage CMOS process to be easily merged with a conventional low-voltage CMOS process with essentially no added complications to the low-voltage CMOS performance. In contrast with earlier methods, these methods produce extremely repeatable and stable high-voltage and low-voltage electrical responses.

Although the foregoing has been a description and illustration of specific embodiments of the invention, various modifications and changes thereto can be made by persons skilled in the art without departing from the scope and spirit of the invention as defined by the following claims. For example, functionally equivalent materials may be substituted for materials of the embodiments described. Also, the HVNMOS FET devices may be formed with only LVNMOS FET devices with a simplified process to create NMOS IC devices. Furthermore, some applications may require the LVNMOS FET devices and LVPMOS FET devices but only one of the HVPMOS FET devices or HVNMOS FET devices. Accordingly, the processes may be simplified as required to create only those devices needed in a particular application.

What is claimed is:

1. A method of making low-voltage CMOS devices and high-voltage CMOS devices formed in a common substrate, the method comprising steps of:

a) defining first and second active device areas and forming a sacrificial film over at least the first and second active device areas, b) within the first active device areas, lithographically patterning device active regions of at least high-voltage CMOS devices, c) forming and patterning field isolation oxide, d) implanting dopants selectively through the sacrificial film into the lithographically defined active device regions of at least high-voltage CMOS devices to form drift regions, e) diffusing the implanted dopants at a first predetermined temperature to form high-voltage CMOS drift regions, f) removing the sacrificial film, g) subsequent to removing the sacrificial film, forming low-voltage CMOS devices in the second active device areas at temperatures below the first predetermined temperature, and h) subsequent to removing the sacrificial film, forming a layer of base oxide over areas of high-voltage gate oxide of the high-voltage CMOS devices and areas of low-voltage gate oxide of the low-voltage CMOS devices; and i) selectively removing said base oxide from said areas of low-voltage gate oxide of the low-voltage CMOS devices such that a portion of said base oxide remaining on said areas of high-voltage gate oxide is thicker than a portion of said base oxide remaining on said areas of low-voltage gate oxide;

in which said forming low-voltage CMOS devices comprises using a salicide process to form self-aligned gates of the low-voltage CMOS devices said high-voltage CMOS devices comprising gates that are not self-aligned.

2. The method of claim 1, wherein the sacrificial film formed over at least the active device areas is a silicon nitride film.

3. The method of claim 1, wherein step b) of lithographically patterning device active regions of at least high-voltage CMOS devices comprises depositing and patterning a photoresist.

4. The method of claim 1, wherein the low-voltage CMOS devices include a low-voltage gate oxide and implanting step d) is performed before forming the low-voltage gate oxide for the low-voltage CMOS devices.

5. The method of claim 1, wherein the low-voltage CMOS devices include a low-voltage-device channel and wherein implanting step d) is performed before any doping of the low-voltage-device channel.

6. The method of claim 1, wherein implanting step d) is performed after step c) of forming the field-isolation oxide.

7. The method of claim 6, wherein implanting step d) is performed while controlling implant energy to be high enough to penetrate the sacrificial film but not high enough to penetrate through the field-isolation oxide.

8. The method of claim 1, wherein the low-voltage CMOS devices include a low-voltage gate oxide and wherein diffusing step e) is performed before forming the low-voltage gate oxide.

9. The method of claim 1, wherein diffusing step e) is performed after step c) of forming the field-isolation oxide.

10. The method of claim 1, wherein the low-voltage CMOS devices include a low-voltage-device channel and wherein diffusing step e) is performed before any doping of the low-voltage-device channel.

11. The method of claim 1, wherein the high-voltage CMOS devices have channel length dimensions and source/drain extension dimensions, the channel length dimensions and source/drain extension dimensions of the high-voltage CMOS devices are defined by step b) of lithographically defining device active regions of high-voltage CMOS devices, and the source/drain extension dimensions are further defined by dielectric spacers.

12. The method of claim 1, wherein the steps are performed in the order recited.

13. An integrated circuit made by the method of claim 1.

14. A method of fabricating high-voltage CMOS devices and low-voltage CMOS devices on a common substrate, the method comprising:

a) forming on the common substrate high-voltage CMOS devices having lithographically defined non-self-aligned gates by implanting high-voltage-device-junction dopants through a sacrificial film and diffusing the high-voltage-device-junction dopants before any low-voltage gate oxide is formed, before any low-voltage-device channel-doping, and before any channel tuning is performed for the low-voltage CMOS devices, and b) subsequent to forming said high-voltage CMOS devices, removing the sacrificial film and forming, on the same common substrate by using a salicide process, low-voltage CMOS devices having self-aligned gates; and c) subsequent to removing the sacrificial film, forming a layer of base oxide over areas of high-voltage gate oxide of the high-voltage CMOS devices and areas of low-voltage gate oxide of the low-voltage CMOS devices; and d) selectively removing said base oxide from said areas of low-voltage gate oxide of the low-voltage CMOS devices such that a portion of said base oxide remaining on said areas of high-voltage gate oxide is thicker than a portion of said base oxide remaining on said areas of low-voltage gate oxide.

15. The method of claim 14, wherein:

the low-voltage CMOS devices are adapted to operate with voltages less than about eight volts, and the high-voltage CMOS devices are adapted to operate with voltages greater than about eight volts.

\* \* \* \* \*